(12) United States Patent
Terhune, IV et al.

(10) Patent No.: US 7,794,261 B2
(45) Date of Patent: Sep. 14, 2010

(54) ELECTRICAL CONNECTOR ASSEMBLY HAVING A ROTATABLE CLIP-FASTENING MECHANISM

(75) Inventors: Albert Harvey Terhune, IV, Chandler, AZ (US); Cheng-Chi Yeh, Tu-cheng (TW); Hao-Yun Ma, Tu-cheng (TW); Darrell Wertz, Chandler, AZ (US); David Gregory Howell, Gilbert, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 64 days.

(21) Appl. No.: 12/317,531

(22) Filed: Dec. 26, 2008

(65) Prior Publication Data

US 2010/0167572 A1 Jul. 1, 2010

(51) Int. Cl.
*H01R 13/62* (2006.01)
(52) U.S. Cl. ...................................... 439/331
(58) Field of Classification Search ................ 439/73, 439/330, 331; 361/719, 720
See application file for complete search history.

(56) References Cited

U.S. PATENT DOCUMENTS

| | | | |
|---|---|---|---|
| 6,875,038 B1 * | 4/2005 | McHugh et al. ............. | 439/331 |
| 7,001,197 B2 | 2/2006 | Shirai et al. | |
| 7,033,198 B2 | 4/2006 | Chiang | |
| 7,160,130 B2 | 1/2007 | Ma | |
| 7,430,121 B2 * | 9/2008 | Lu et al. .................... | 361/719 |
| 7,628,634 B2 * | 12/2009 | Yeh et al. ................... | 439/331 |

* cited by examiner

*Primary Examiner*—Neil Abrams
(74) *Attorney, Agent, or Firm*—Andrew C. Cheng; Wei Te Chung; Ming Chieh Chang

(57) ABSTRACT

An electrical connector assembly (100) comprising a substrate (6), an electrical connector mounted onto the upper surface (60) of the substrate (6) and comprising an insulative housing (8) with a plurality of contacts (9) and a load plate (1) pivotally mounted onto the substrate (6) adjacent to the insulative housing (8) and substantially covering the insulative housing (8), a reinforcing member (5) assembled to the lower surface of the substrate (6) and an interlocking cam (22) rotationally mounted on a free end of the load plate (1), and extending through the substrate (6) to interlock to the reinforcing member (5) at a first position in which the load plate (1) is pressed toward the insulative housing (8), and rotated to a second position in which the load plate (1) is free to move away from the insulative housing (8). The rotatable cam (22) includes a recess (222) that when interlocked with a projecting member (5211) extending into a hole (521) in a back plate (52) serves to fasten the load plate (1) in closed position.

20 Claims, 6 Drawing Sheets

ELECTRICAL CONNECTOR ASSEMBLY HAVING A ROTATABLE CLIP-FASTENING MECHANISM

BACKGROUND OF THE INVENTION

1. Field of the Invention

The present invention relates to an electrical connector assembly, and more particularly, to an electrical connector assembly having a clip-fastening mechanism to make it easy to close or open a load plate.

2. Description of the Prior Art

U.S. Pat. No. 7,001,197 issued to Shirai on Feb. 21, 2006 discloses a conventional electrical connector for electrically connecting a CPU with a PCB and comprises an insulative housing with a plurality of contacts received therein has a top surface for receiving an package, a load plate pivotally mounted on a first end of the insulative housing and a lever pivotally mounted on a second end of the insulative housing. The load plate is pivotal between an open position and a closed position where the load plate presses the package electrically connects to the contacts. The load plate has an interlocking portion and the lever has a locking portion interlocked with the interlocking portion for locking the load plate in the closed position.

U.S. Pat. No. 7,160,130 issued to Ma on Jan. 9, 2007 discloses a conventional electrical connector for electrically connecting a CPU with a PCB and comprises a socket body having a number of contacts, a stiffener attached to the socket body, a load plate and a lever pivotally mounted to two ends of the stiffener respectively. The load plate is pivotal between an open position and a closed position where the load plate presses the package electrically connects to the contacts. The load plate has an interlocking portion and the lever has a locking portion interlocked with the interlocking portion for locking the load plate in the closed position.

U.S. Pat. No. 7,033,198 issued to Chiang on Apr. 25, 2006 discloses a conventional electrical connector comprises a substrate having an upper and lower surface, a socket body with a plurality of contacts mounted onto the upper surface of the substrate, a base mounted onto the lower surface of the substrate, a load plate and a load lever pivotally mounted to two ends of the base respectively. The load plate is pivotal between an open position and a closed position where the load plate presses the package electrically connects to the contacts. The load plate has an interlocking portion and the lever has a locking portion interlocked with the interlocking portion for locking the load plate in the closed position.

When operate the lever to make the load plate in the closed position, the interlocking element must be lower than the locking portion, otherwise, the locking portion can not press on the interlocking portion, which will cause the load plate can not press the CPU. On the other hand, this type of electrical connector using lever to lock the load plate is hard to operate due to the shake of the lever.

In view of the above, a new electrical connector assembly that overcomes the above-mentioned disadvantages is desired.

SUMMARY OF THE INVENTION

Accordingly, an object of the present invention is to provide an electrical connector assembly having a unique interlocking device to make it easy to lock or open the load plate.

To fulfill the above-mentioned object, An electrical connector assembly comprising a substrate having an upper and lower surface, an electrical connector mounted onto the upper surface of the substrate and comprising an insulative housing with a plurality of contacts and a load plate pivotally mounted onto the substrate adjacent to the insulative housing, and substantially covering the insulative housing, a reinforcing member assembled to the lower surface of the substrate corresponding to the load plate, and an interlocking cam rotationally mounted on a free end of the load plate, and extending through the substrate to interlock with the reinforcing member at a first position in which the load plate is pressed toward the insulative housing, and rotated to a second position in which the load plate is free to move away from the insulative housing.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
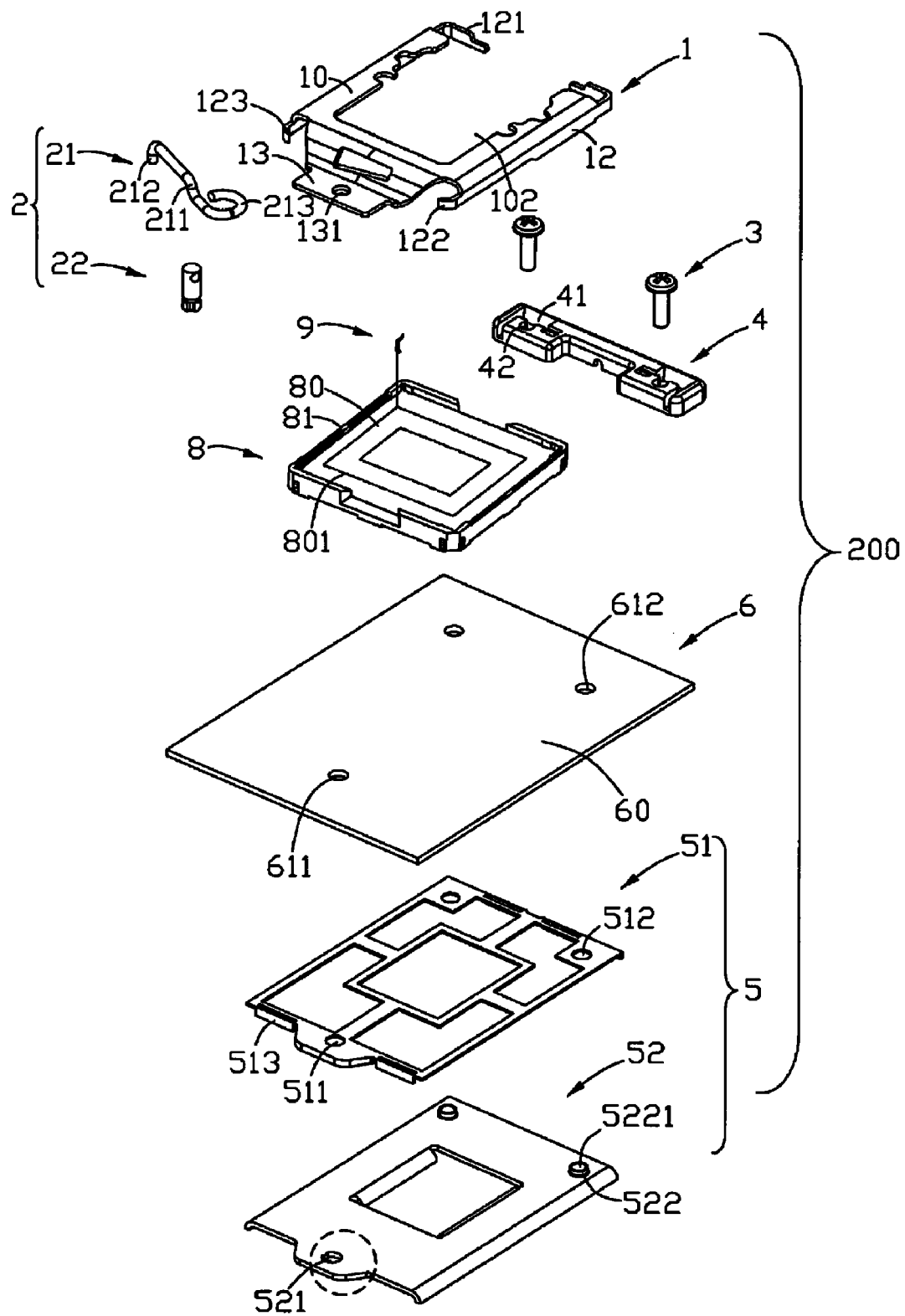
FIG. 1 is an exploded view of an electrical connector assembly in accordance with the preferred embodiment of the present invention.
Figure 2:
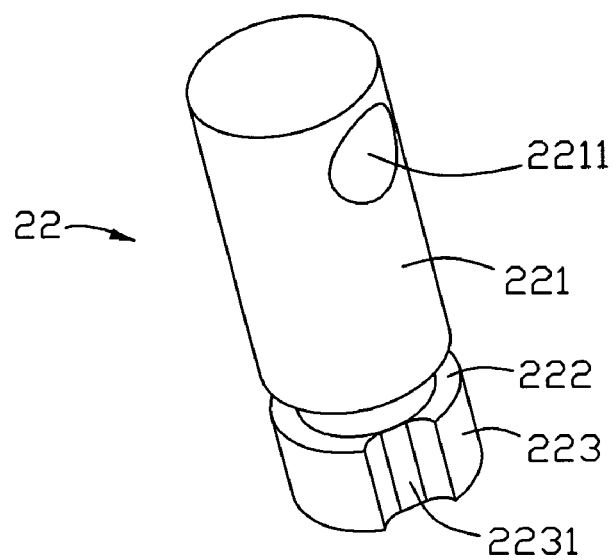
FIG. 2 is an isometric view of the interlocking cam of the electrical connector assembly of the present invention.
Figure 3:
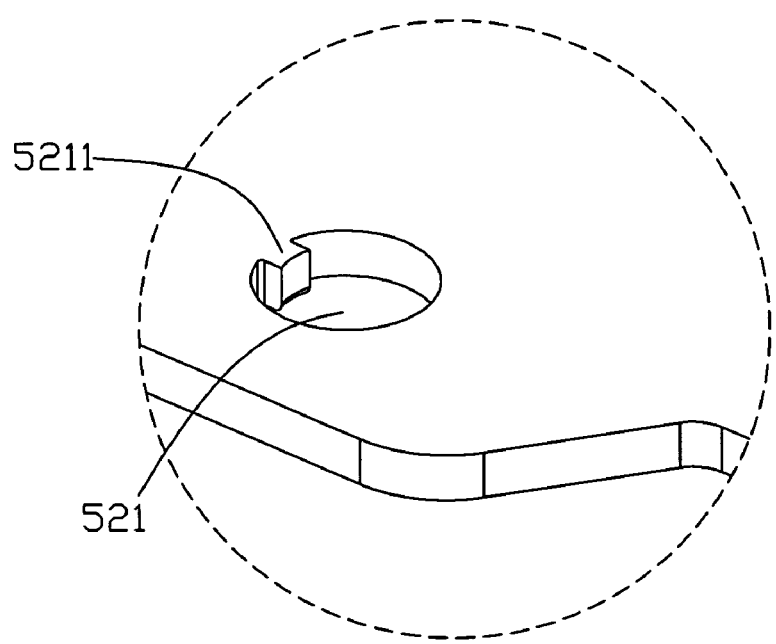
FIG. 3 is a partial enlarged view of the back plate of the present invention shown in FIG. 1.

Referring to FIGS. 1-3, an electrical connector assembly 200 in accordance with the present invention comprises an electrical connector (not labeled) assembled on an upper surface 60 of a PCB (printed circuit board) 6, a reinforcing member 5 assembled on a bottom surface (not labeled) opposite to the upper surface 60 of the circuit substrate 6, and a interlocking device 2 assembled on the electrical connector. The electrical connector is used for electrically connecting an electronic package, such as a land grid array (LGA) central processing unit (CPU) (not shown), with a circuit substrate, such as a PCB 6. The electrical connector comprises an insulative housing 8 with a plurality of contacts 9 received therein, a fix member 4, a load plate 1 assembled on the fix member 4 and a pair of nuts 3 for fixing the load plate 1 on the PCB 6.

The insulative housing 8 is configured to a rectangular shape and comprises a bottom wall 80, four sidewalls 81 extending upwardly from the bottom wall 80 and a receiving space 801 formed by the bottom wall 80 and the sidewalls 81. The receiving space 801 is used to receive the CPU. The contacts 9 are received in the bottom wall 80 with a contact portion (not labeled) located in the receiving space 801 for electrically connecting with the CPU. The fix member 4 is positioned adjacent one of the sidewalls 81 of the insulative housing 8 and comprises an L-shaped slot 41 and a fix hole 42 communicated with the slot 41.

The load plate 1 is made of metal sheet and comprises a body plate 10, a pair of side plates 12 extending downwardly from the body plate 10 and a tongue portion 13 extends forwardly from the body plate 10. One of the side plate 12 comprises a first locking portion 122 and the other comprises a second locking portion 123, the two locking portions 122, 123 both extends first forwardly from the side plate 122 and then extends toward the tongue portion 13. Each of the side plates 12 also defines an L-shaped fasten portion 121 extending backwardly from the side plate 12. The tongue portion 13 defines a hole 131.

The interlocking device 2 comprises a lever 21 and a interlocking cam 22. The lever 21 is made of wire and comprises a body portion 211, a block portion 212 and a stopper portion 213. The block portion 212 is extending curvedly from one end of the body portion 211 and then extending in a vertical direction. The stopper portion 213 is extending curvedly from the other end of the body portion 211 and is configured to a annular shape. The interlocking cam 22 is configured to a column shape and comprises an upper portion 221, a bottom portion 223 and a recess 222 between the upper portion 221 and the bottom portion 223. The upper portion 221 comprises a through hole 2211 at the upper end thereof and the bottom portion 223 comprises a channel 2231 communicated with the recess 222. The channel 2231 goes through the bottom portion 223 in a vertical direction and has the same depression depth with the recess 222.

The reinforcing member 5 comprises a back plate 52 and a insulator 51 positioned between the PCB 6 and the back plate 52. The back plate 52 is made of metal fastened to the PCB 6. The back plate 52 includes a first hole 521 corresponding to the hole 131 of the load plate 1, a protruding member 5211 extending to the first hole 521 and a pair of posts 522. The post 522 defines a hole 5221 goes through the back plate 52 and the hole 5221 is corresponding to the fix hole 42 of the fix member 4. The insulator 51 is configured to a plate shape and defines a pair of hooks 513 interlocked with the back plate 52. The insulator 51 covers the whole back plate 52 and comprises a hole 511 corresponding to the first hole 521 of the back plate 52 and a pair of holes 512 corresponding to the posts 522. The PCB 6 comprises a hole 611 corresponding to the hole 131 of the load plate 1 and a pair of holes 612 corresponding to the fix hole 42 of the fix member 4.

Figure 4:
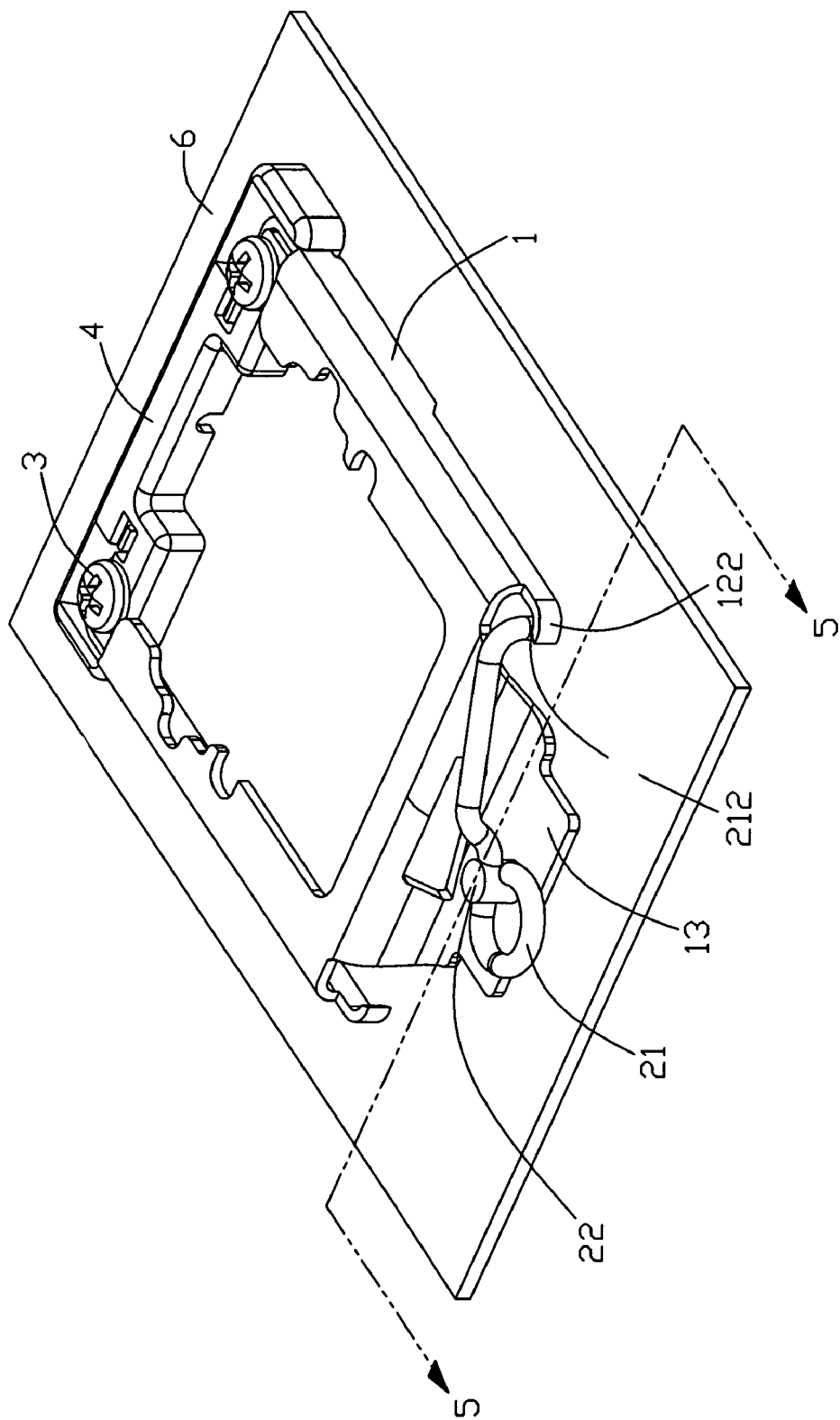
FIG. 4 is an assembled view of FIG. 1, showing the load plate at a close position.
Figure 5:
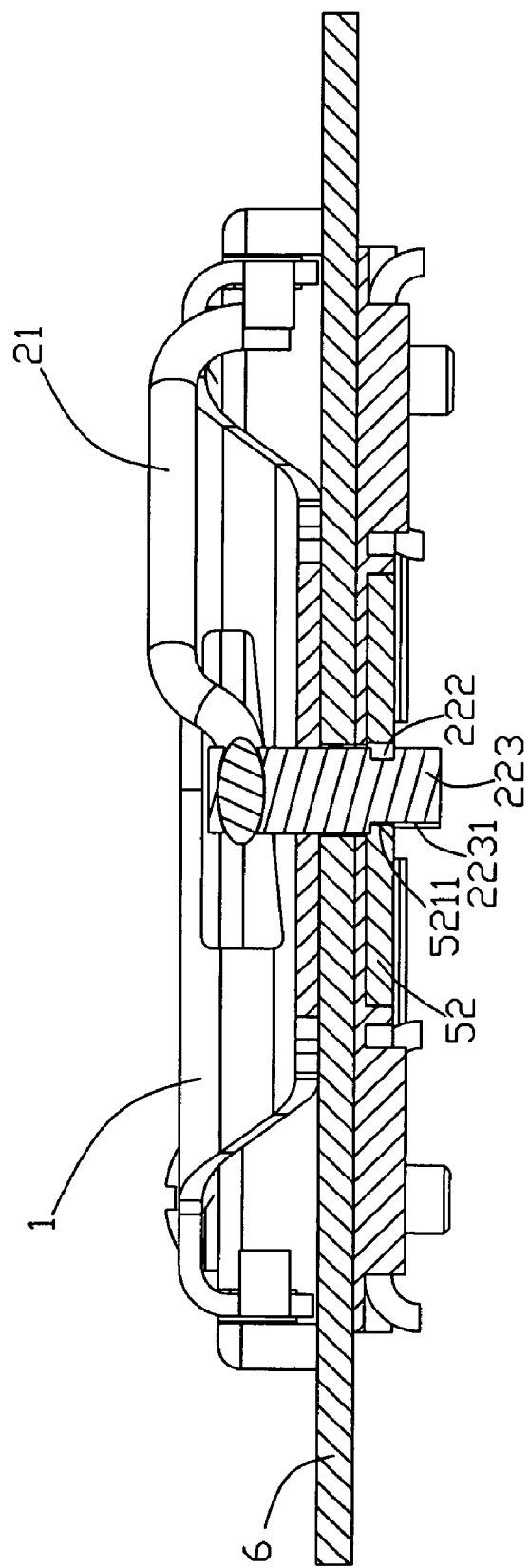
FIG. 5 is a cross-sectional view of FIG. 4 taken along the line 5-5, showing the protruding member of the back plate positioned in the recess and is blocked by the bottom portion of the interlocking cam.
Figure 6:
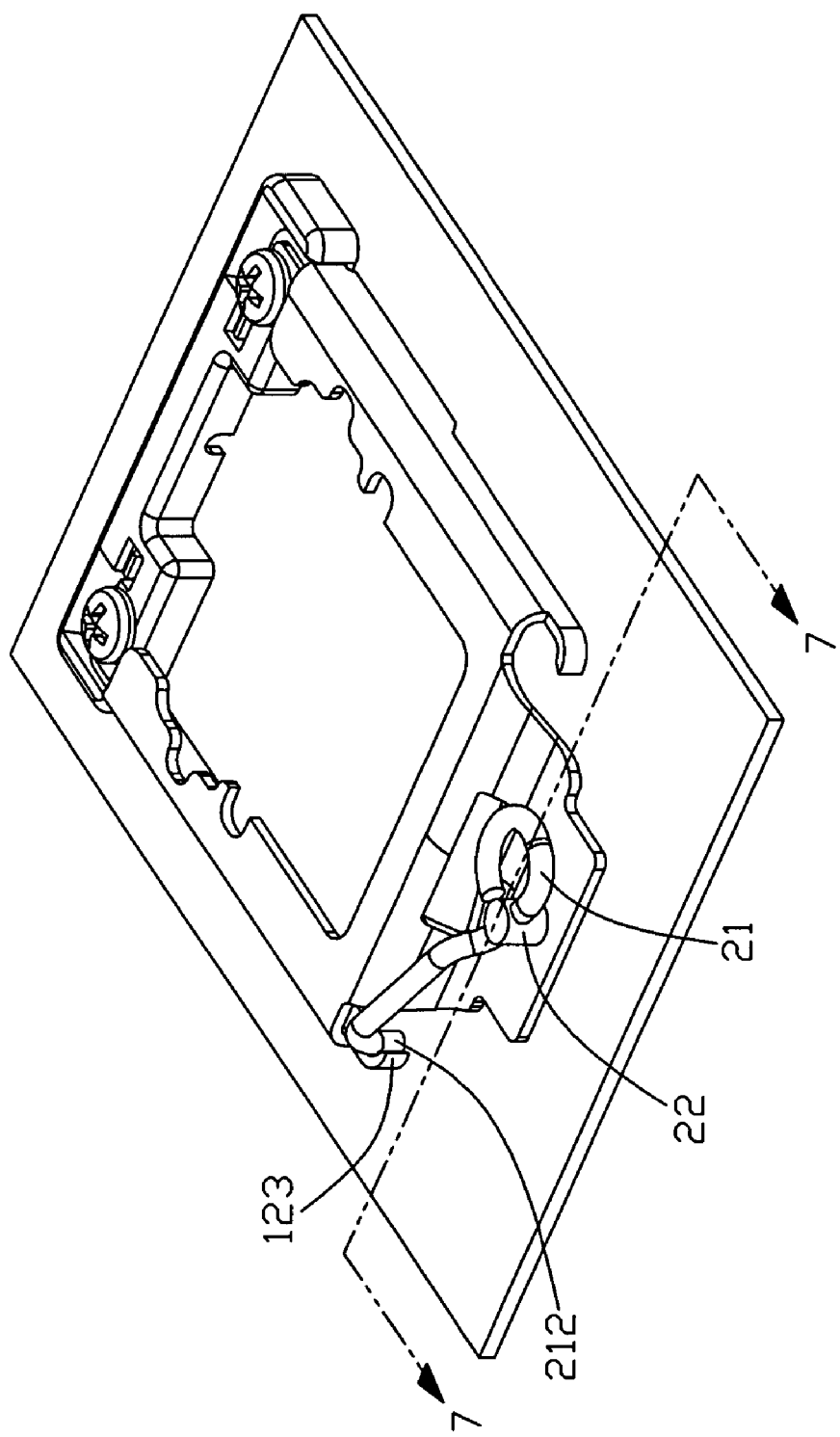
FIG. 6 is an assembled view of FIG. 1, showing the load plate in an open position.
Figure 7:
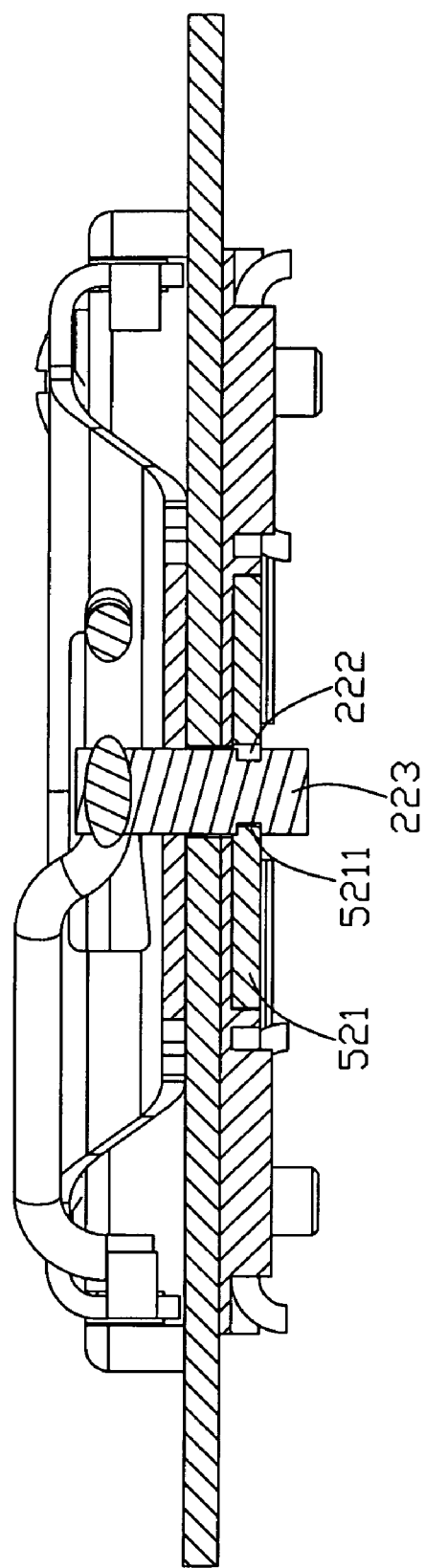
FIG. 7 is a cross-sectional view of FIG. 5 taken along the line 7-7, showing the protruding member of the back plate is positioned in the channel of the interlocking cam.

Referring to FIG. 4, showing the assembled view of the electrical connector assembly 200, the insulative housing 8 and the fix member 4 are assembled on the upper surface 60 of the PCB 6, and the fix member 4 is positioned adjacent to one of the side walls 81 of the insulative housing 8. The load plate 1 is covered on the insulative housing 8 and the L-shaped fasten portion 121 is located in the L-shaped slot 41. The nut 3 goes through the fix hole 42 of the fix member 4, the hole 612 of the PCB 6, the hole 512 of the insulator 51 and the hole 5221 of the back plate 52 to fasten the load plate 1, the fix member 4, the insulator 51 and the back plate 52 on the PCB 6. The post 522 of the back plate 52 is received in the hole 512 of the insulator 51. The lever 21 goes through the through hole 2211 of the interlocking cam 22 and the interlocking cam 22 goes through the holes 131, 611, 511 and the first hole 521 to make the load plate 1 in a close position.

Referring to FIGS. 4-7, which shows the operating process of the electrical connector assembly 100. When the CPU is assembled into the receiving space 810 of the insulative housing 8, rotate the lever 21 to make the block portion 212 positioned in the first locking portion 122, and the interlocking cam 22 is in a first position. At this position, the protruding member 5211 of the back plate 52 is positioned in the channel 2231 of the interlocking cam 22. Then press down the interlocking cam 22 to make the protruding member 5211 move up to the recess 222 along the channel 2231. Afterward, rotate the lever 21 to make the block portion 212 position in the second locking portion 123 and the interlocking cam 22 is rotated to a second position. At this position, the protruding member 5211 moves in the recess 222 far away from the channel 2231 and is blocked by the bottom portion 223 of the interlocking cam 22. The load plate 1 is at a close position.

In order to open the load plate 1, rotate the lever 21 to make the interlocking cam 22 in the first position, the protruding member 5211 will move down along the channel 2231 and the load plate 1 can be put up to the open position, then the CPU can be took out.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
    a substrate having an upper and lower surface;
    an electrical connector mounted onto the upper surface of the substrate and comprising an insulative housing with a plurality of contacts and a load plate pivotally mounted onto the substrate adjacent to the insulative housing, and substantially covering the insulative housing;
    a reinforcing member assembled to the lower surface of the substrate corresponding to the load plate; and
    an interlocking cam rotationally mounted on a free end of the load plate, and extending through the substrate to interlock with the reinforcing member at a first position in which the load plate is pressed toward the insulative housing, and rotated to a second position in which the load plate is free to move away from the insulative housing.

2. The electrical connector assembly as claimed in claim 1, wherein the interlocking cam comprises an upper portion, a bottom portion and a recess between the upper portion and the bottom portion.

3. The electrical connector assembly as claimed in claim 2, wherein the upper portion comprises a through hole at the upper end thereof and the bottom portion comprises a channel connected with the recess.

4. The electrical connector assembly as claimed in claim 3, wherein the electrical connector assembly comprises a lever goes through the through hole to fasten the two together.

5. The electrical connector assembly as claimed in claim 3, wherein the channel goes through the bottom portion in a vertical direction and has the same depression depth with the recess.

6. The electrical connector assembly as claimed in claim 5, wherein the reinforcing member comprises a first hole having a protruding member extending into the first hole.

7. The electrical connector assembly as claimed in claim 6, wherein the channel is matched with the protruding member to permit the protruding member goes along the channel, and the load plate is in the open position.

8. The electrical connector assembly as claimed in claim 6, wherein the protruding member is positioned in the recess and blocked by the bottom portion, and the load plate is in the close position.

9. The electrical connector assembly as claimed in claim 1, wherein the load plate comprises a body plate, two side plates extending downwardly from the body plate, a tongue portion extending forwardly from the body plate, a first lock portion and a second lock portion extending forwardly and toward the tongue portion from the side plate.

10. The electrical connector assembly as claimed in claim 9, wherein the lever comprises a base portion and a vertically block portion extending curvedly from the base portion blocked with the lock portion of the load plate.

11. A clip-fastening mechanism adapted to press a CPU toward a socket connector mounted on a substrate, comprising:
   a substrate having an upper and lower surface;
   a reinforcing member assembled to the lower surface of the substrate; and
   a load plate pivotally mounted onto the upper surface of the substrate corresponding to the reinforcing member, and including an interlocking device having an interlocking cam rotationally mounted onto a free end thereof, the interlocking cam including a channel located at a first position in which the interlocking cam is engaged with a portion of the reinforcing member, and a second position in which the interlocking cam is disengaged with the portion of the reinforcing member.

12. The clip-fastening mechanism as claimed in claim 11, wherein the interlocking cam comprises an upper portion, a bottom portion and a recess located between the upper portion and the bottom portion.

13. The clip-fastening mechanism as claimed in claim 12, wherein the upper portion comprises a through hole at the upper end thereof and the channel is located on the bottom portion connected with the recess.

14. The clip-fastening mechanism as claimed in claim 13, wherein the clip-fastening mechanism comprises a lever goes through the through hole to fasten the two together.

15. The clip-fastening mechanism as claimed in claim 13, wherein the reinforcing member comprises a first hole having a protruding member extending into the first hole.

16. The clip-fastening mechanism as claimed in claim 15, wherein the channel is matched with the protruding member to permit the protruding member goes along the channel, and the load plate is in the open position.

17. The clip-fastening mechanism as claimed in claim 15, wherein the protruding member is positioned in the recess and blocked by the bottom portion, and the load plate is in the close position.

18. A socket assembly comprising:
   a printed circuit board defining opposite upper surface and undersurface thereof with a through hole extending through both said upper surface and said undersurface;
   a housing mounted upon the upper surface of the printed circuit board with a plurality of contacts thereof;
   a load plate located above the housing;
   a back plate mounted to the undersurface of the and defining a hole, in alignment with the through hole; and
   an interlocking cam extending through the load plate, the through hole and the hole; wherein
   a protrusion is formed in the hole and the interlocking cam defines a channel to allow said protrusion to pass therethrough when said interlocking cam is located in a first radial position, and to have the protrusion downwardly abut against the interlocking cam for locking the interlocking cam in position so as to have the load plate and the back plate are both in a tensioned manner via said interlocking cam when the interlocking cam is rotated to a second radial position.

19. The socket assembly as claimed in claim 18, further including a lever assembled to the interlocking cam for operation with one end engaged with the load plate when said interlocking cam is located in at least one of the first position and the second position; wherein said lever provides a downward force against the load plate when said interlocking cam is located in the second radial position.

20. The socket assembly as claimed in claim 18, wherein said protrusion is dimensioned not to exceed one half interior circumference of said hole, and said channel is dimensioned not to exceed one half exterior circumference of said interlocking cam.

* * * * *